US009353339B2

(12) United States Patent
Choi et al.

(10) Patent No.: US 9,353,339 B2
(45) Date of Patent: May 31, 2016

(54) COMPOSITION FOR REMOVING AND PREVENTING FORMATION OF OXIDE ON THE SURFACE OF METAL WIRE

(71) Applicant: LTC Co., Ltd., Gyeonggi-do (KR)

(72) Inventors: Ho Sung Choi, Gyeonggi-do (KR); Kwang Hyun Ryu, Gyeonggi-do (KR); Jong Il Bae, Gyeonggi-do (KR); Jong Soon Lee, Gyeonggi-do (KR); Hye Sung Yang, Gyeonggi-do (KR); Sang Ku Ha, Gyeonggi-do (KR)

(73) Assignee: LTC Co., Ltd., Anyang (KR)

( * ) Notice: Subject to any disclaimer, the term of this patent is extended or adjusted under 35 U.S.C. 154(b) by 0 days.

(21) Appl. No.: 14/648,647

(22) PCT Filed: Jul. 24, 2013

(86) PCT No.: PCT/KR2013/006615
§ 371 (c)(1),
(2) Date: May 29, 2015

(87) PCT Pub. No.: WO2014/017819
PCT Pub. Date: Jan. 30, 2014

(65) Prior Publication Data
US 2015/0299628 A1    Oct. 22, 2015

(30) Foreign Application Priority Data

Jul. 24, 2012   (KR) .................... 10-2012-0080440

(51) Int. Cl.
*C11D 3/28*    (2006.01)
*C11D 3/30*    (2006.01)
(Continued)

(52) U.S. Cl.
CPC .......... *C11D 11/0029* (2013.01); *C11D 3/2003* (2013.01); *C11D 3/2041* (2013.01);
(Continued)

(58) Field of Classification Search
CPC .. C11D 3/2003; C11D 3/2041; C11D 3/2068; C11D 3/28; C11D 3/30; C11D 3/3481; C11D 3/349; C11D 3/43; C11D 7/263; C11D 7/267; C11D 7/3218; C11D 7/3281; C11D 7/34; C11D 7/50
USPC ......... 510/175, 176, 255, 261, 262, 263, 264, 510/492, 499, 500, 505, 506
See application file for complete search history.

(56) References Cited

U.S. PATENT DOCUMENTS

2006/0003910 A1    1/2006  Hsu
2010/0056410 A1*   3/2010  Visintin ................. C11D 1/008
                                                        510/176

(Continued)

FOREIGN PATENT DOCUMENTS

JP       11131094       5/1999
JP       2006009006     1/2006

(Continued)

OTHER PUBLICATIONS

Korean Search Report for corresponding Korean application serial No. PCT/KR2013/006615 dated Oct. 16, 2013.

*Primary Examiner* — Gregory R Delcotto
(74) *Attorney, Agent, or Firm* — McDonnell Boehnen Hulbert & Berghoff LLP

(57) ABSTRACT

The present invention proposes a method for removing an oxide formed on the surface of a copper film used in the process of manufacturing a circuit for a semiconductor, an organic light-emitting diode, an LED, or a liquid crystal display without causing corrosion on a lower metal film. The composition including corrosive amine may remove a metal oxide depending on the content of additive ranging from 0.01 to 10% regardless of the content of ultrapure water. A polar solvent other than the corrosive amine may efficiently remove an oxide from the surface of the metal when the same contains water and 0.01 to 20% of the additive.

6 Claims, 5 Drawing Sheets

(51) Int. Cl.
*C11D 3/43* (2006.01)
*C11D 7/32* (2006.01)
*C11D 11/00* (2006.01)
*C11D 3/20* (2006.01)
*C23G 1/20* (2006.01)
*H01L 21/02* (2006.01)
*C11D 7/34* (2006.01)
*C11D 7/50* (2006.01)
*C23C 22/02* (2006.01)
*C23C 22/63* (2006.01)
*C23F 11/16* (2006.01)

(52) U.S. Cl.
CPC ............ *C11D3/2068* (2013.01); *C11D 7/3209* (2013.01); *C11D 7/34* (2013.01); *C11D 7/5004* (2013.01); *C11D 7/5013* (2013.01); *C11D 7/5022* (2013.01); *C11D 11/0047* (2013.01); *C23C 22/02* (2013.01); *C23C 22/63* (2013.01); *C23F 11/165* (2013.01); *C23G 1/20* (2013.01); *H01L 21/02068* (2013.01)

(56) References Cited

U.S. PATENT DOCUMENTS

2011/0034362 A1* 2/2011 Egbe .................... C11D 3/0073
510/176
2012/0000485 A1 1/2012 Mizuta

FOREIGN PATENT DOCUMENTS

| JP | 2006114872 | 4/2006 |
| KR | 1020060125752 | 6/2006 |
| KR | 1020110028109 | 3/2011 |

* cited by examiner

Step 1:

Cu Film          Additive of
                 Chemical Formula 1

Step 2:

Cu Film          Additive of
                 Chemical Formula 1

COMPOSITION FOR REMOVING AND PREVENTING FORMATION OF OXIDE ON THE SURFACE OF METAL WIRE

CROSS-REFERENCE TO RELATED APPLICATIONS

This application is a national stage application under 35 U.S.C. §371 of International Application No. PCT/KR2013/006615, filed Jul. 24, 2013, which claims priority to Korean Application No. 1020120080440, filed Jul. 24, 2012, the disclosure of each of which are explicitly incorporated by reference herein in their entirety.

BACKGROUND OF THE INVENTION

1. Field of the Invention

The present invention relates to a composition for removing and preventing the formation of an oxide on the surface of a metal wire. More specifically, the present invention relates to a composition for removing an oxide on the surface of a metal wire formed in the process of manufacturing a circuit for a semiconductor, or a circuit for a liquid crystal display (LCD), a light-emitting diode (LED) or an organic light-emitting diode (OLED) display device, and preventing the formation of the oxide.

2. Description of Related Art

Metal wiring circuits used in semiconductor circuits or in circuits for liquid crystal display (LCD), light emitting diode (LED) or organic light emitting diode (OLED) display devices become more and more miniaturized in their structures as the circuits become integrated.

Meanwhile, metals such as Al, Ti, Cu, Ag and Au have been used as the materials of metal wire. Among these, Cu has been widely used over various fields due to its excellent electrical conductivity and relatively low costs. However, Cu is very readily oxidized even in the atmosphere, therefore, the surface of a wire using Cu becomes covered with an oxide as it passes through a unit process that progresses wiring. In other words, the surface of a wire using Cu becomes covered with an oxide as it passes through a heat treatment process capable of depositing a low dielectric material, an exposure process capable of determining the shape of a metal wire using a photosensitive material, an etching process capable of forming a metal wiring film after the exposure process, and a peeling-off process removing the photosensitive material remaining on the surface of the metal wiring film after the etching process. However, such an oxide lowers electrical conductivity of Cu itself, increases electrical resistance, and eventually, makes it difficult to obtain a fine low voltage circuit structure. Consequently, Cu has not been used as a metal used in circuits for OLED display devices so far.

Therefore, finer metal circuit wiring may be obtained when electrical conductivity of a metal wire itself can be maintained by removing an oxide on the surface of a metal wire formed while passing through such various processes. However, metal oxide film and metal film have very similar properties, and selectively removing the metal oxide has not been possible so far.

BRIEF SUMMARY OF THE INVENTION

Technical Problem

An object of the present invention is to provide a composition capable of selectively removing an oxide on the surface of a metal wire.

Another object of the present invention is to provide a composition capable of preventing the formation of an oxide on the surface of a metal wire.

Still another object of the present invention is to provide a composition capable of preventing corrosion on a lower metal film while being capable of removing an oxide on the surface of a metal wire and preventing the formation of the oxide.

Technical Solution

A composition for removing and preventing the formation of an oxide on the surface of a metal wire according to the present invention includes a compound represented by the following Chemical Formula 1 in 0.01 to 20% by weight; an organic solvent in 10 to 99.99% by weight; and water in 0 to 70% by weight:

[Chemical Formula 1]

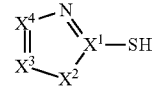

In Chemical Formula 1, $X^1$ is C or S,
$X^2$ is $CR^1{}_2$, $NR^2$, O or S, and herein, $R^1$ and $R^2$ are each independently hydrogen, $C_{1-12}$ alkyl, $C_{1-12}$ alkylthiol or $C_{1-12}$ alkoxy, $C_{6-12}$ awl, or hydroxy, and
$X^3$ and $X^4$ are each independently $CR^3$ or N, and herein, $R^3$ is each independently hydrogen, $C_{1-12}$ alkyl or $C_{1-12}$ alkylthiol, or hydroxy, and herein, when $X^3$ and $X^4$ are all $CR^3$ and $R^3$ is $C_{1-12}$ alkyl, carbons at the end of $R^3$, a substituent, may bond to each other to form a saturated or unsaturated ring.

In one embodiment of the present invention, the compound represented by Chemical Formula 1 is selected from the group consisting of phenylmercaptotetrazole, mercaptobenzothiazole, mercaptobenzimidazole, mercaptobenzothiadiazole, mercaptobenzoxazole, mercaptomethyltetrazole, methylthiadiazolethiol, methoxymercaptobenzimidazole, cyclohexylmercaptoimidazole, mercaptoimidazole, mercaptomethylimidazole, mercaptoethylimidazole, mercaptopropylimidazole, mercaptoethyleneimidazole, mercaptopropyleneimidazole, cyclopentylmercaptoimidazole, cycloheptylimidazole, cyclooctylimidazole, mercapto(beta-4-pyridethyl)benzimidazole, mercaptonaph(2,3)thyimidazole, hydroxyoxidoaminomercapto-1H-imidazole, mercaptomethylnitroimidazole, and a mixture thereof.

In one embodiment of the present invention, the organic solvent is an amine-based solvent.

In one embodiment of the present invention, the amine-based solvent is selected from the group consisting of monoethanolamine, monoisopropylamine, diethanolamine, triethanolamine, N-methyldiethanolamine, diisopropylamine, aminopropanol, monomethylethanolamine, aminoethylethanolamine, dimethylethanolamine, morpholine, N-methylmorpholine, N-ethylmorpholine, N-aminoethylpiperazine, dimethylpiperazine, dimethylaminopropylamine, aminopropylmorpholine, methoxypropylamine, pentamethyldiethyleneamine, ethylenediamine, diethylenetriamine, triethylenetetraamine, tetraethylenepentaamine, and a mixture thereof.

In another embodiment of the present invention, the organic solvent is selected from the group consisting of alcohol-based solvents, amide-based solvents, glycol-based solvents, glycol ether-based solvents and a mixture thereof, and the water is included in 1 to 70% by weight.

In one embodiment of the present invention, the organic solvent is selected from the group consisting of ethylene glycol monomethyl ether, propylene glycol propyl ether, diethylene glycol monomethyl ether, ethylene glycol monobutyl ether, triethylene glycol butyl ether, ethylene glycol monoethyl ether, diethylene glycol monoethyl ether, diethylene glycol monobutyl ether, tripropylene glycol methyl ether, ethylene glycol methyl ether acetate, ethylene glycol monobutyl ether acetate, diethylene glycol monobutyl ether acetate, 3-methoxy-1-butanol, dipropylene glycol monomethyl ether, propylene glycol dimethyl ether, 3-methoxy-1-propanol, 2-ethoxy ethyl acetate, n-methyl-2-pyrrolidone, ethylene carbitol, propylene carbitol, gammabutyl lactone, dimethyl sulfoxide, sulfolane, dimethylformamide, tetrahydrofurfuryl alcohol, propargyl alcohol, triethylene glycol monoethyl ether, polyethylene glycol monoethyl ether, propylene glycol monomethyl ether, ethylene glycol monoisopropyl ether, ethylene glycol monoisobutyl ether, diethylene glycol monophenyl ether, and a mixture thereof.

In one embodiment of the present invention, the metal is Cu.

Advantageous Effects

A composition according to the present invention prevents the corrosion of a lower metal film while selectively removing an oxide on the surface of a metal wire, and preventing the formation of the oxide on the surface of the metal wire. Therefore, it is capable of maintaining electrical conductivity of a metal wire itself and is capable of finer metal circuit wiring.

DETAILED DESCRIPTION OF THE INVENTION

Figure 1:
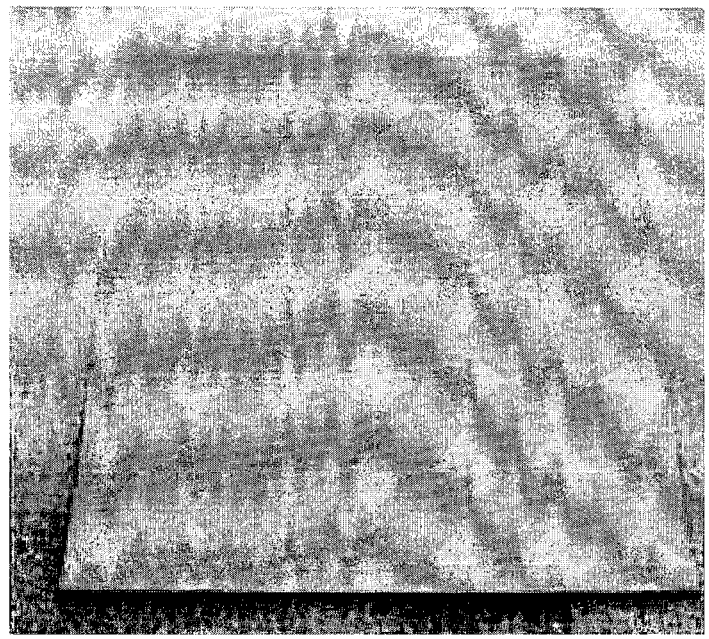
FIG. 1 is a photograph of a glass image immediately after depositing Cu.
Figure 2:
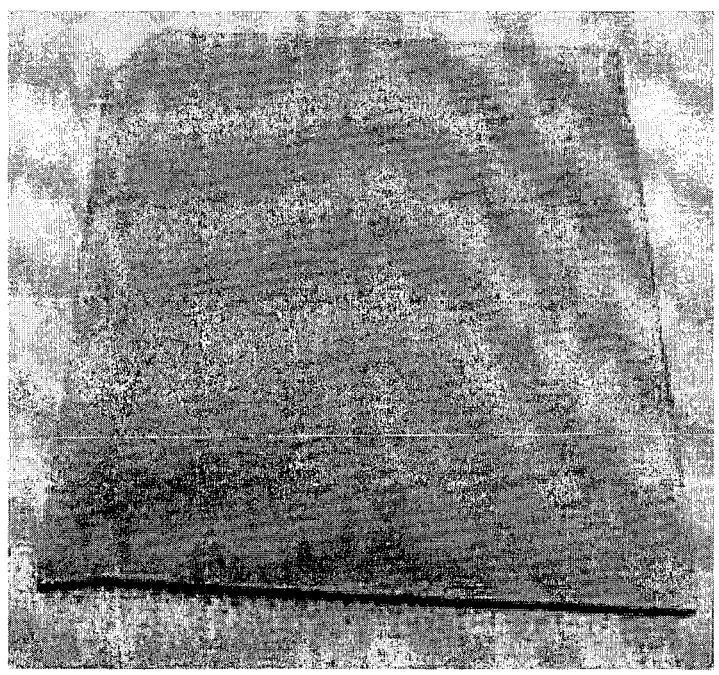
FIG. 2 is a photograph of an image after artificially forming an oxide on the surface of a metal by holding up the glass of FIG. 1 for 20 minutes on a heating plate at 170° C.
Figure 3:
FIG. 3 is a photograph of an image of the glass of FIG. 2 being sunk in a beaker containing a composition according to the present invention.
Figure 4:
FIG. 4 is a photograph taken after taking out the glass of FIG. 3, which shows a result in which water drops favorably spread in parts that oxides are formed in large quantities, and shows a result in which water drops do not spread well in regions that oxides are removed.
Figure 5:
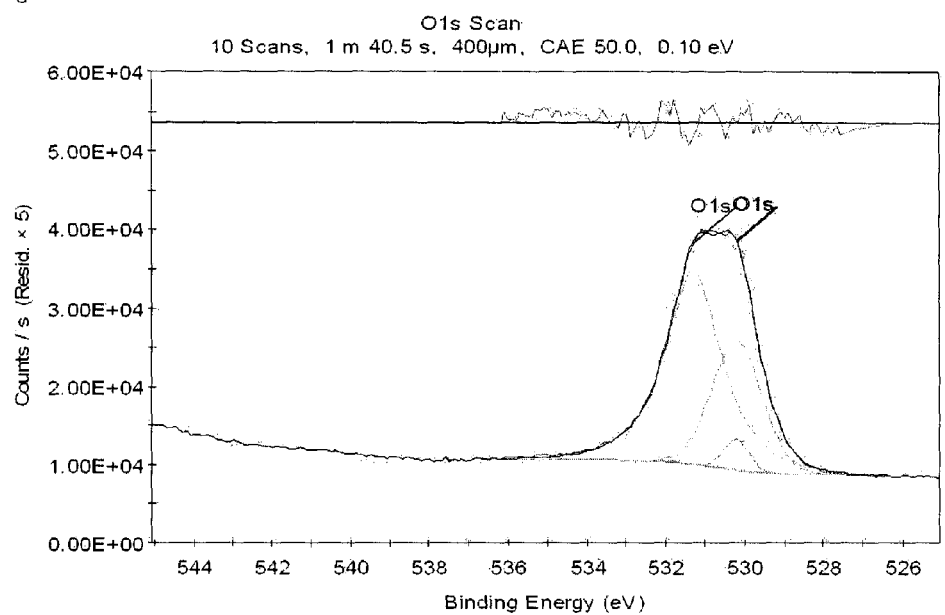
FIG. 5 is a result of XPS analysis carried out on the glass of FIG. 1.
Figure 6:
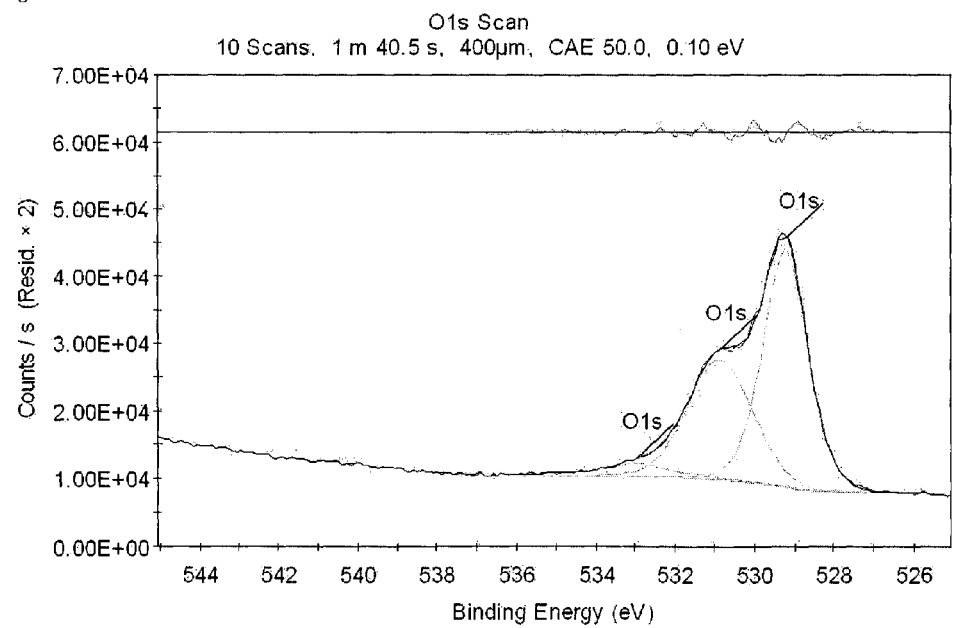
FIG. 6 is a result of XPS analysis carried out on the glass of FIG. 2.
Figure 7:
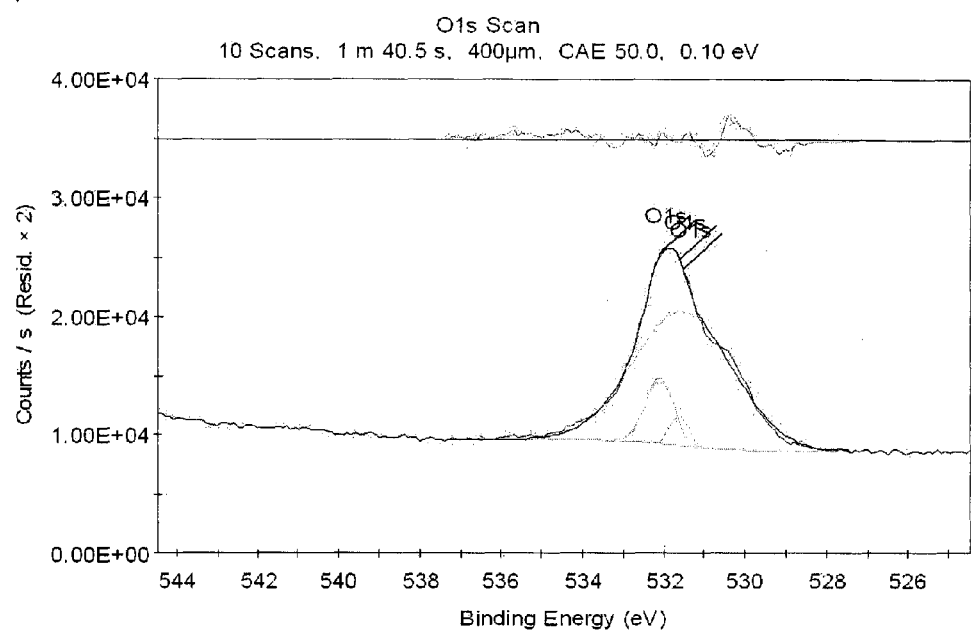
FIG. 7 is a result of XPS analysis carried out after removing a metal oxide using a composition according to the present invention.

A composition for removing and preventing the formation of an oxide on the surface of a metal wire according to the present invention includes a compound represented by the following Chemical Formula 1 in 0.01 to 20% by weight; an organic solvent in 10 to 99.99% by weight; and water in 0 to 70% by weight:

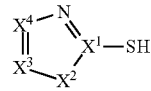

[Chemical Formula 1]

In Chemical Formula 1, $X^1$ is C or S, $X^2$ is $CR^1{}_2$, $NR^2$, O or S, and herein, $R^1$ and $R^2$ are each independently hydrogen, $C_{1-12}$ alkyl, $C_{1-12}$ alkylthiol or $C_{1-12}$ alkoxy, $C_{6-12}$ aryl, or hydroxy, and $X^3$ and $X^4$ are each independently $CR^3$ or N, and herein, $R^3$ is each independently hydrogen, $C_{1-12}$ alkyl or $C_{1-12}$ alkylthiol, or hydroxy, and herein, when $X^3$ and $X^4$ are all $CR^3$ and $R^3$ is $C_{1-12}$ alkyl, carbons at the end of $R^3$, a substituent, may bond to each other to form a saturated or unsaturated ring.

In one embodiment of the present invention, the compound represented by Chemical Formula 1 is selected from the group consisting of phenylmercaptotetrazole, mercaptobenzothiazole, mercaptobenzimidazole, mercaptobenzothiadiazole, mercaptobenzoxazole, mercaptomethyltetrazole, methylthiadiazolethiol, methoxymercaptobenzimidazole, cyclohexylmercaptoimidazole, mercaptoimidazole, mercaptomethylimidazole, mercaptoethylimidazole, mercaptopropylimidazole, mercaptoethyleneimidazole, mercaptopropyleneimidazole, cyclopentylmercaptoimidazole, cycloheptylimidazole, cyclooctylimidazole, mercapto(beta-4-pyridethyl)benzimidazole mercaptonaph(2,3)thyimidazole, hydroxyoxidoaminomercapto-1H-imidazole mercaptomethylnitroimidazole, and a mixture thereof.

In one embodiment of the present invention, the organic solvent is an amine-based solvent. In this case, an oxide on the surface of a metal wire may be selectively removed whether or not water is included.

In one embodiment of the present invention, the amine-based solvent is selected from the group consisting of monoethanolamine, monoisopropylamine, diethanolamine, triethanolamine, N-methyldiethanolamine, diisopropylamine, aminopropanol, monomethylethanolamine, aminoethylethanolamine, dimethylethanolamine, morpholine, N-methylmorpholine, N-ethylmorpholine, N-aminoethylpiperazine, dimethylpiperazine, dimethylaminopropylamine, aminopropylmorpholine, methoxypropylamine, pentamethyldiethyleneamine, ethylenediamine, diethylenetriamine, triethylenetetraamine, tetraethylenepentaamine, and a mixture thereof.

In another embodiment of the present invention, the organic solvent is selected from the group consisting of alcohol-based solvents, amide-based solvents, glycol-based solvents, glycol ether-based solvents and a mixture thereof, and the water is included in 1 to 70% by weight. In other words, when the organic solvent includes alcohol-based solvents, amide-based solvents, glycol-based solvents, glycol ether-based solvents and the like without including amine-based solvents, water needs to be included in order to selectively remove an oxide on the surface of a metal wire.

In one embodiment of the present invention, the organic solvent is selected from the group consisting of ethylene glycol monomethyl ether, propylene glycol propyl ether, diethylene glycol monomethyl ether, ethylene glycol monobutyl ether, triethylene glycol butyl ether, ethylene glycol monoethyl ether, diethylene glycol monoethyl ether, diethylene glycol monobutyl ether, tripropylene glycol methyl ether, ethylene glycol methyl ether acetate, ethylene glycol monobutyl ether acetate, diethylene glycol monobutyl ether acetate, 3-methoxy-1-butanol, dipropylene glycol monomethyl ether, propylene glycol dimethyl ether, 3-methoxy-propanol, 2-ethoxyethyl acetate, n-methyl-2-pyrrolidone, ethylene carbitol, propylene carbitol, gamma butyl lactone, dimethyl sulfoxide, sulforan, dimethylformamide, tetrahydrofurfuryl alcohol, propargyl alcohol, triethylene glycol monoethyl ether, polyethylene glycol monoethyl ether, propylene glycol monomethyl ether, ethylene glycol monoisopropyl ether, ethylene glycol monoisobutyl ether, diethylene glycol monophenyl ether, and a mixture thereof.

In one embodiment of the present invention, the metal is Cu.

Figure 8:
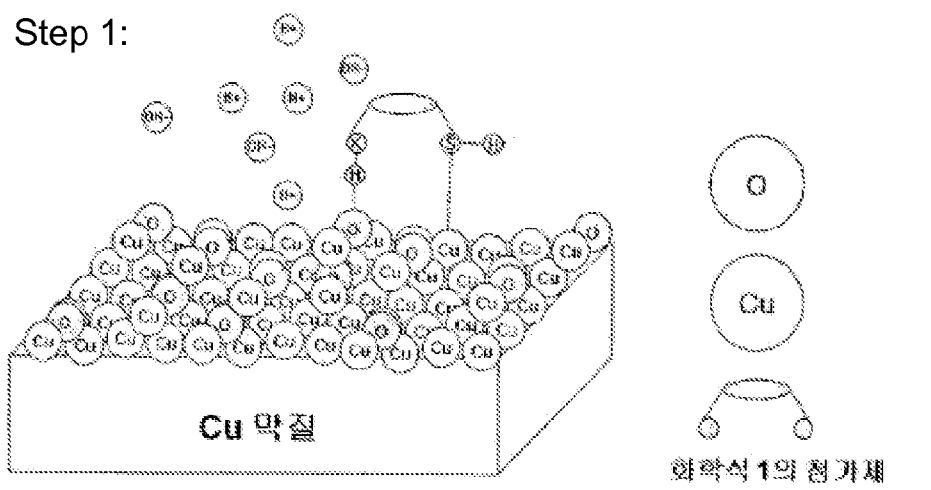
FIG. 8 illustrates a mechanism of removing an oxide on the surface of a metal wire.
Figure 8:
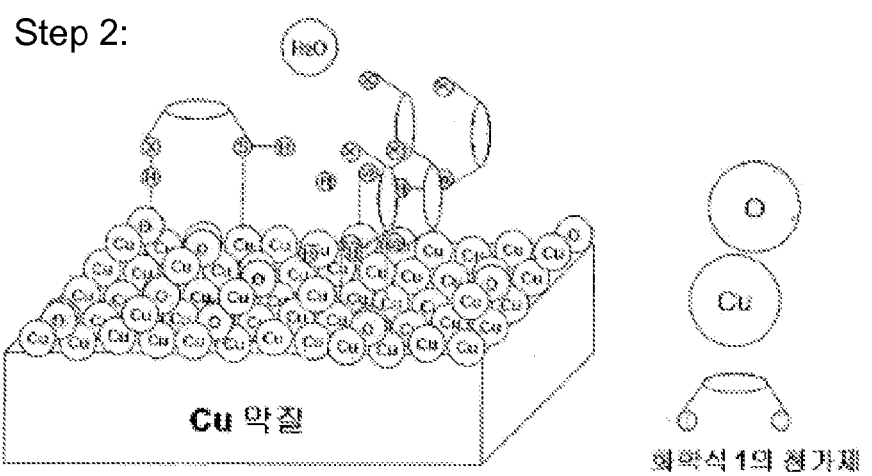

In the present invention, a mechanism of removing an oxide on the surface of a metal wire is provided in FIG. 8.

FIG. 8, Step L: When water is present, a sulfur atom (S) of a mercapto group (SH) bonding to the compound represented by Chemical Formula 1 is coordinate bonded to a metal (Cu), and a heteroatom (N, O or S) (X) forming the compound represented by Chemical Formula 1 and having unshared electron pairs is coordinate bonded to an oxygen atom (O) of a metal oxide with a hydrogen atom bonding thereto or a hydrogen ion ($H^+$) in the composition as a medium.

FIG. 8, Step 2: Next, the hydrogen ion ($H^+$) and the oxygen atom (O) of the metal oxide bonding thereto bond to a hydrogen ion (H) present in the composition, and enter into the composition in the form of water ($H_2O$).

When the oxygen atom is removed from the metal oxide and when a pure metal surface is revealed, further formation of a metal oxide is prevented by the compound represented by Chemical Formula 1 coordinate bonded to the metal through the mercapto group.

In addition, the compound represented by Chemical Formula 1 coordinate bonded to the metal through the mercapto group prevents corrosion by protecting the surface of the metal wire.

Meanwhile, when water is not present, the oxygen atom of the metal oxide is removed from the surface by an amine groups or a hydroxyl group in the composition.

Finally, the mercapto group (SH) is very weakly bonded to the surface of the metal, and is readily cut by hydrogen bonding of water in an ultrapure water cleaning process afterward and is removed from the surface of the metal.

Hereinafter, the present invention will be described in more detail with reference to examples. However, the following example is for illustrative purposes only, and the scope of the present invention is not limited to the following example.

Example

An oxide was artificially formed on the surface of a metal film by holding up a glass deposited with a metal for 20 minutes on a heating plate at 170° C., and then the metal film in which the oxide was formed was sunk in a composition according to the present invention for 20 minutes while maintaining a temperature at 40° C., and then the metal film was taken out. Removal of the oxide from the metal surface and corrosion of the metal was observed with the naked eye. During a test, a Cu metal film was used as an upper metal film of the glass.

Table 1 is a case using an amine-based solvent as the organic solvent, and Table 2 is a case using a non-amine-based solvent as the organic solvent. The content unit of the constituents listed in the following Table 1 and Table 2 is a % by weight. The test results are evaluated using the following criteria, and the results are shown in Table 1 and Table 2.

Removal of Oxide
ⓞ: The metal oxide was removed within 2 minutes
Δ: The metal oxide was removed after 2 minutes
X: The metal oxide was not removed Degree of Metal Corrosion
ⓞ: Same condition as a control group substrate
O: Film thickness was the same compared to a control group substrate, minor corrosion occurred on the surface
Δ: Film thickness was a little reduced compared to a control group substrate, and corrosion occurred on the surface
X: Film thickness was reduced by ½ or greater compared to a control group substrate due to corrosion

TABLE 1

| Component 1 | Content | Component 2 | Content | Water | Content | Oxide Removal | Degree of Metal Corrosion |
|---|---|---|---|---|---|---|---|
| MI | 1 | MEA | 50 | Included | 49 | ⓞ | ⓞ |
| MBO | 1 | MIPA | 99 | Not Included | 0 | ⓞ | ⓞ |
| MBTD | 1 | DEA | 50 | Included | 49 | ⓞ | ⓞ |
| MI | 1 | TEA | 99 | Not Included | 0 | ⓞ | ⓞ |
| MBO | 1 | MDEA | 50 | Included | 49 | ⓞ | ⓞ |
| MBTD | 1 | DIPA | 99 | Not Included | 0 | ⓞ | ⓞ |
| MI | 1 | AMP | 50 | Included | 49 | ⓞ | ⓞ |
| MBO | 1 | MMEA | 99 | Not Included | 0 | ⓞ | ⓞ |
| MBTD | 1 | AEEA | 50 | Included | 49 | ⓞ | ⓞ |
| MI | 1 | DMEA | 99 | Not Included | 0 | ⓞ | ⓞ |
| MBO | 1 | MOR | 50 | Included | 49 | ⓞ | ⓞ |
| MBTD | 1 | NMM | 99 | Not Included | 0 | ⓞ | ⓞ |
| MI | 1 | NEM | 50 | Included | 49 | ⓞ | ⓞ |
| MBTD | 1 | AEP | 99 | Not Included | 0 | ⓞ | ⓞ |
| MI | 1 | DMP | 50 | Included | 49 | ⓞ | ⓞ |
| MBO | 1 | DMAPA | 99 | Not Included | 0 | ⓞ | ⓞ |
| MBTD | 1 | MOPA | 50 | Included | 49 | ⓞ | ⓞ |
| MI | 1 | APM | 99 | Not Included | 0 | ⓞ | ⓞ |

TABLE 1-continued

| Component 1 | Content | Component 2 | Content | Water | Content | Oxide Removal | Degree of Metal Corrosion |
|---|---|---|---|---|---|---|---|
| MBO | 1 | DMCHA | 50 | Included | 49 | ☺ | ☺ |
| MBTD | 1 | PMDETA | 99 | Not Included | 0 | ☺ | ☺ |
| MI | 1 | EDA | 50 | Included | 49 | ☺ | ☺ |
| MBO | 1 | DETA | 99 | Not Included | 0 | ☺ | ☺ |
| MBTD | 1 | TETA | 50 | Included | 49 | ☺ | ☺ |
| MI | 1 | TEPA | 99 | Not Included | 0 | ☺ | ☺ |

MI: mercaptoimidazole
MBO: mercaptobenzoxazole
MBTD: mercaptobenzthiadiazole
MEA: monoethanolamine
MIPA: monoisopropylamine
DEA: diethanolamine
TEA: triethanolamine
MDEA: n-methyldiethanolamine
DIPA: diisopropylamine
AMP: aminopropanol
MMEA: monomethylethanolamine
AEEA: aminoethylethanolamine
DMEA: dimethylethanolamine
MOR: morpholine
NMM: N-methylmorpholine
NEM: N-ethylmorpholine
AEP: N-aminoethylpiperazine
DMP: dimethylpiperazine
DMAPA: dimethylaminopropylamine
MOPA: dimethylpiperazine
APM: aminopropylmotpholine
DMCHA: dimethylaminopropylamine
MOPA: methoxypropylamine
APM: aminopropylmotpholine
PMDETA: pentamethyldiethyleneamine
EDA: ethylenediamine
DETA: diethylenetriamine
TETA: triethylenetetraamine
TEPA: tetraethylenepentaamine

TABLE 2

| Component 1 | Content | Component 2 | Content | Water | Content | Oxide Removal | Degree of Metal Corrosion |
|---|---|---|---|---|---|---|---|
| MI | 1 | NMP | 50 | Included | 49 | ☺ | ☺ |
| MBO | 1 | EC | 49 | Included | 50 | ☺ | ☺ |
| MBTD | 1 | PC | 50 | Included | 49 | ☺ | ☺ |
| MI | 1 | GBL | 49 | Included | 50 | ☺ | ☺ |
| MBO | 1 | DMSO | 50 | Included | 49 | ☺ | ☺ |
| MBTD | 1 | Sulforan | 49 | Included | 50 | ☺ | ☺ |
| MI | 1 | DMF | 50 | Included | 49 | ☺ | ☺ |
| MBO | 1 | THFA | 49 | Included | 50 | ☺ | ☺ |
| MBTD | 1 | PA | 50 | Included | 49 | ☺ | ☺ |
| MI | 1 | MG | 49 | Included | 50 | ☺ | ☺ |
| MBO | 1 | MDG | 50 | Included | 49 | ☺ | ☺ |
| MBTD | 1 | EG | 49 | Included | 50 | ☺ | ☺ |
| MI | 1 | EDG | 50 | Included | 49 | ☺ | ☺ |
| MBO | 1 | ETG | 49 | Included | 50 | ☺ | ☺ |
| MBTD | 1 | EPG | 50 | Included | 49 | ☺ | ☺ |
| MI | 1 | BDG | 49 | Included | 50 | ☺ | ☺ |
| MBO | 1 | MFG | 50 | Included | 49 | ☺ | ☺ |
| MBTD | 1 | BFG | 49 | Included | 50 | ☺ | ☺ |
| MI | 1 | iPG | 50 | Included | 49 | ☺ | ☺ |
| MBO | 1 | iBG | 49 | Included | 50 | ☺ | ☺ |
| MBTD | 1 | PC | 99 | Not Included | 0 | X | ☺ |
| MI | 1 | GBL | 99 | Not Included | 0 | X | ☺ |
| MBO |  | DMSO | 99 | Not Included | 0 | X | ☺ |

TABLE 2-continued

| Component 1 | Content | Component 2 | Content | Water | Content | Oxide Removal | Degree of Metal Corrosion |
|---|---|---|---|---|---|---|---|
| MBTD | 1 | Sulforan | 99 | Not Included | 0 | X | ◎ |
| MI | 1 | DMF | 99 | Not Included | 0 | X | ◎ |
| MBTD | 1 | PA | 99 | Not Included | 0 | X | ◎ |

NMP: n-methyl-2-pyrrolidone
EC: ethylene carbitol
PC: propylene carbitol
GBL: gamma butyl lactone
DMSO: dimethyl sulfoxide
Sulfolane: sulfolane
DMF: dimethylformamide
THFA: tetrahydrofurfuryl alcohol
PA: propargyl alcohol
MG: ethylene glycol monomethyl ether
MDG: diethylene glycol monomethyl ether
EG: ethylene glycol monoethyl ether
EDG: diethylene glycol monoethyl ether
ETG: triethylene glycol monoethyl ether
EPG: polyethylene glycol monoethyl ether
BDG: diethylene glycol monobutyl ether
MFG: propylene glycol monomethyl ether
iPG: ethylene glycol monoisopropyl ether
iBG: ethylene glycol monoisobutyl ether
BFG: diethylene glycol monophenyl ether
PGPE: propylene glycol propyl ether
EGMEA: ethylene glycol monobutyl ether acetate While the present invention has been described with reference to exemplary embodiments, it will be apparent to those skilled in the art that various modifications may be made without departing from the scope of the present invention, and constituents of the present invention may be substituted with equivalents. In addition, specific conditions and materials may be employed in the instruction of the present invention by performing various modifications without departing from the essential scope of the present invention. Accordingly, the present invention is not limited to the disclosed specific embodiments as a best mode planned to implement the present invention, and the present invention shall be interpreted to include all embodiments that belong to the appended claims.

The invention claimed is:

1. A composition for removing and preventing the formation of an oxide on the surface of a metal wire consisting of:
a compound represented by Chemical Formula 1 in an amount from 0.01 to 20% by weight;
an organic solvent in an amount from 10 to 99.99% by weight; and
water in an amount from 0 to 70% by weight;
wherein Chemical Formula 1 is:

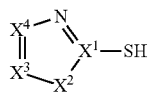

wherein
$X^1$ is C or S;
$X^2$ is $CR^1_2$, $NR^2$, O or S, and herein, $R^1$ and $R^2$ are each independently hydrogen, $C_{1-12}$ alkyl, $C_{1-12}$ alkylthiol, $C_{1-12}$ alkoxy, $C_{6-12}$ aryl, or hydroxyl; and
$X^3$ and $X^4$ are each independently $CR^3$ or N, and each $R^3$ is independently hydrogen, $C_{1-12}$ alkyl, $C_{1-12}$ alkylthiol, or hydroxy, and herein, when $X^3$ and $X^4$ are all $CR^3$ and $R^3$ is $C_{1-12}$ alkyl, carbons at the end of $R^3$, a substituent, bond to each other to form a saturated or unsaturated ring.

2. The composition for removing and preventing the formation of an oxide on the surface of a metal wire of claim 1, wherein the organic solvent is an amine-based solvent.

3. The composition for removing and preventing the formation of an oxide on the surface of a metal wire of claim 2, wherein the amine-based solvent is selected from the group consisting of monoethanolamine, monoisopropylamine, diethanolamine, triethanolamine, N-methyldiethanolamine, diisopropylamine, aminopropanol, monomethylethanolamine, aminoethylethanolamine, dimethylethanolamine, morpholine, N-methylmorpholine, N-ethylmorpholine, N-aminoethylpiperazine, dimethylpiperazine, dimethylaminopropylamine, aminopropylmorpholine, methoxypropylamine, pentamethyldiethyleneamine, ethylenediamine, diethylenetriamine, triethylenetetraamine, tetraethylenepentaamine, and a mixture thereof.

4. The composition for removing and preventing the formation of an oxide on the surface of a metal wire of claim 1, wherein the organic solvent is selected from the group consisting of alcohol-based solvents, amide-based solvents, glycol-based solvents, glycol ether-based solvents and a mixture thereof, and the water is present in an amount from 1 to 70% by weight.

5. The composition for removing and preventing the formation of an oxide on the surface of a metal wire of claim 4, wherein the organic solvent is selected from the group consisting of ethylene glycol monomethyl ether, propylene glycol propyl ether, diethylene glycol monomethyl ether, ethylene glycol monobutyl ether, triethylene glycol butyl ether, ethylene glycol monoethyl ether, diethylene glycol monoethyl ether, diethylene glycol monobutyl ether, tripropylene glycol methyl ether, ethylene glycol methyl ether acetate, ethylene glycol monobutyl ether acetate, diethylene glycol monobutyl ether acetate, 3-methoxy-1-butanol, dipropylene glycol monomethyl ether, propylene glycol dimethyl ether, 3-methoxy-1-propanol, 2-ethoxy ethyl acetate, n-methyl-2-pyrrolidone, ethylene carbitol, propylene carbitol, gammabutyl lactone, dimethyl sulfoxide, sulforan, dimethylformamide, tetrahydrofurfuryl alcohol, propargyl alcohol, triethylene glycol monoethyl ether, polyethylene glycol monoethyl ether, propylene glycol monomethyl ether, ethylene glycol monoisopropyl ether, ethylene glycol monoisobutyl ether, diethylene glycol monophenyl ether, and a mixture thereof.

6. The composition for removing and preventing the formation of an oxide on the surface of a metal wire of claim 1, wherein the metal is Cu.

\* \* \* \* \*